United States Patent [19] [11] 4,157,926
Schoolar [45] Jun. 12, 1979

[54] METHOD OF FABRICATING A HIGH ELECTRICAL FREQUENCY INFRARED DETECTOR BY VACUUM DEPOSITION

[75] Inventor: Richard B. Schoolar, Silver Spring, Md.

[73] Assignee: The United States of America as represented by the Secretary of the Navy, Washington, D.C.

[21] Appl. No.: 918,133

[22] Filed: Jun. 22, 1978

Related U.S. Application Data

[62] Division of Ser. No. 771,717, Feb. 24, 1977.

[51] Int. Cl.² .................. H01L 21/363; H01L 27/14
[52] U.S. Cl. ...................................... 148/175; 29/572; 136/89 SJ; 148/188; 250/211 J; 250/212; 250/330; 250/338; 250/370; 357/15; 357/30
[58] Field of Search ................... 148/175, 188, 1.5; 136/89; 29/572, 211 J; 250/212, 330, 338, 370; 357/15, 30

[56] References Cited

U.S. PATENT DOCUMENTS

| 3,146,138 | 8/1964 | Shirland | 148/187 |
|---|---|---|---|
| 3,433,677 | 3/1969 | Robinson | 136/89 |
| 3,454,847 | 7/1969 | Zuleeg et al. | 148/175 X |
| 3,502,517 | 3/1970 | Sussmann | 148/175 |
| 3,515,957 | 6/1970 | Kitagawa | 148/187 X |
| 3,614,661 | 10/1971 | Borner et al. | 357/30 X |
| 3,616,527 | 11/1971 | Janning | 148/191 X |
| 3,716,424 | 2/1973 | Schoolar | 148/175 |
| 3,904,879 | 9/1975 | Amingual et al. | 250/338 |
| 3,961,998 | 6/1976 | Scharnhorst et al. | 148/175 |

OTHER PUBLICATIONS

Kitamura; S., "Influences of Heat-treatment . . . Cadmium Sulphide . . . J. Physical Soc. of Japan, vol. 16, No. 12, Dec. 1961, pp. 2430–2439.
Nill et al., "Laser . . . Metal Semiconductor . . . PbSnTe", Applied Physics Letters, vol. 16, No. 10, 15 May 1970, pp. 375–377.
Jensen et al., "Surface Charge . . . PbSnSe . . . Films", J. Vac. Sci. Tech., vol. 13, No. 4, Jul./Aug. 1976, pp. 920–925.

Primary Examiner—L. Dewayne Rutledge
Assistant Examiner—W. G. Saba
Attorney, Agent, or Firm—R. S. Sciascia; A. L. Branning; R. E. Bushnell

[57] ABSTRACT

A thin-film single-crystal infrared detector exhibiting an increased frequency of response. A closed transverse junction, formed by diffusing a central electrode of an impurity rich metal into a lead-salt film epitaxially grown on an insulating substrate, provides an effective optical area in excess of the junction surface. An ohmic contact is spaced apart from the central electrode. Junction capacitance, a limitation upon the electrical response, is diminished by the detector geometry while detectivity is enhanced. In an alternative embodiment the detector may be segmented to provide directional detection.

6 Claims, 9 Drawing Figures

METHOD OF FABRICATING A HIGH ELECTRICAL FREQUENCY INFRARED DETECTOR BY VACUUM DEPOSITION

CROSS REFERENCE TO RELATED APPLICATIONS

This application is a divisional of my earlier filed application, Ser. No. 771,717, filed on the 24th day of February, 1977, now copending, for the purpose of obtaining the benefits specified under 35 U.S.C. 121.

BACKGROUND OF THE INVENTION

The present invention relates to single crystal semiconductors sensitive to electromagnetic radiation. More particularly, the present invention involves the geometry of photovoltaic detectors.

It has been found that the maximum voltage obtainable from a semiconductor device containing a single P-N junction is always limited to the width of the semiconductor bandgap or energy gap. The bandgap is the forbidden region of the electron energy spectrum in the semiconductor, and is equivalent to the energy range between the bottom of the conduction band and the top of the valence band. The conduction band is the range of states in the energy spectrum of a solid in which electrons can move freely, while the valence band is the range of energy states in a solid crystal in which electron vacancies, or "holes," can freely move.

It is known that a large class of semiconductor devices are photovoltaic. Such devices contain a rectifying barrier, or a P-N junction, at the interface or boundary between regions of the semiconductor having different electrical properties. In a P-N junction, the boundary is a transition region between P-type and N-type conductivity semiconductor region materials. N-type conductivity semiconductor materials are those in which the charge carriers of electrical current are principally negative electrons. P-type conductivity semiconductor materials are those in which the charge carriers of electrical current are primarily electron-deficiency centers which act as positive holes. When a device of this class is exposed to light, it develops a voltage across the terminals of the unit. The term "light" is used in this application as not limited to the visible spectrum of electromagnetic radiation, but in the broad sense or radiant energy. Such devices do not require any external power supply, nor in a single P-N junction device, biasing of the junction, and are known as photovoltaic cells. Cells prepared with multiple, back-to-back junctions however, require an external power supply in order to bias alternate junctions.

A photovoltaic detector, typically a junction device, converts energy from impingent electromagnetic radiation into a photocurrent or a no-load potential difference. Discrete quanta of radiation with energy $E_\lambda$, enter the thin layer adjacent to the surface of the detector with sufficient energy (i.e., $E_{80} \geq E_g$) to liberate an electron-hole pair. As these charge carriers diffuse to the potential gradient of the P-N junction, the majority charge carriers are repelled by, and the minority charge carriers are attracted to, and swept across, the junction thus generating a flow of electric charges. If the light reaches the semiconductor at a distance greater than the minority carrier diffusion length L from the rectifying barrier, the liberated carriers tend to combine before they reach the barrier, and therefore do not contribute to the photocurrent. If the junction is externally shorted, a photocurrent flows, reducing minority carrier densities on each side of the junction to their equilibrium values. If the junction is not shorted, a photovoltage is generated across the junction.

A photovoltaic detector may be characterized by three basic parameters: the spectral range over which it responds, the speed with which it responds, and the smallest radiant power it can detect. The spectral range is a function of $E_g$ of the semiconductor, which is dependent upon the composition from which the detector is fabricated. The response speed is limited by the more dominant of either the effective lifetime of the photoexcited minority carriers or by circuit characteristics, particularly the RC time constant $\tau_c$, where R is the circuit resistance and C is the junction capacitance. In contempory detectors carrier lifetimes vary between $10^{-9}$ and $10^{-8}$ seconds while the RC time constant is typically in excess of $10^{-6}$ seconds. In recent years, the centuries old impetus to increase the capacity of communication systems has focused upon a reduction in the time required to handle each unit of information. Photoemissive devices capable of generating signals with very short pulse durations, perhaps on the order of nanoseconds per pulse, are now available. Compatible ancillary analogue and digital signal processing circuits (e.g. preamplifiers) have long been available. The long electrical response time of photovoltaic detectors provided by the present art has forestalled construction of a photo-electric communication system utilizing the quick response time of recently available photoemissive devices, thereby denying a further enhancement of network capacity to the communication industry.

The third basic parameter, the smallest radiant power detectible by a photovolatic device, is generally indicated by $P_{N,\lambda}$, the noise equivalent power. Its reciprocal, normalized to an effective optical area of one square centimeter and a spectral response bandwidth of one Hertz, is the detectivity, $D_\lambda^*$. Detectivity is directly proportional to the quantum or external efficiency, $\eta$, of the detector, a value which is in turn proportional to the collection or internal efficiency, $\eta_{coll}$. The quantum efficiency is defined as the ratio of the number of electrons crossing the junction to the number of protons incident upon the effective optical area of the detector. The collection efficiency is defined as the ratio of charge-carrier pairs separated by the electric field of the P-N junction to the total number of pairs generated. Both efficiencies are enhanced by a detector geometry providing for an increase in the number of electron-hole pairs generated within a diffusion length of the junction. Those not familiar with collection efficiency will find greater detail in *Limitations and Possibilities For Improvement of Photovoltaic Solar Energy Converters*, by M. Wolf, and published in Volume 48 of the Proceedings of the IRE in 1960. The diffusion length is the average distance that a charge carrier diffuses between generation and recombination; on the average only those charge carrier pairs within a diffusion length of the junction will be collected. Photovolatic detectors provided by the present art, such as that taught by Daniel Amingual, et alii, in U.S. Pat. No. 3,904,879, for example, depend upon electrical contacts that are separated from the junction by one or more sections of the detector layer, thereby increasing the distance that a minority charge carrier must travel in order to contribute to the current flow, and thus, the probability of recombination before reaching the contact. The quantum efficiency, and thus the detectivity of the present art thin-film devices is limited by their geometry as the operative surfaces of their electrical contacts are unnecessarily remote from the junction.

SUMMARY OF THE INVENTION

In accordance with this invention impurities from a central electrode diffuse into a host epitaxial thin-film layer of P-type conductivity to form a region of N-type conductivity, thereby creating a nearly cylindrical transverse junction extending through the layer to the insulating substrate. By allowing a reduction in junction area, and thus in junction capacitance, this geometry provides a photodetector having a reduced electrical response time without a concomitant impairment in detectivity. An ohmic contact surrounding, but spaced apart from the central diffused electrode may be segmented to provide directional detection. Other features of the photodetector include simplicity of fabrication and ease in mounting.

It is an object of the present invention to provide an improved photovolatic detector.

It is another object of the present invention to provide a photovoltaic detector having a shorter response time.

It is a further object of the present invention to provide a photovoltaic detector having a reduced junction capacitance.

It is still another object of the present invention to provide a photovoltaic detector having a shorter response time and an enhanced detectivity.

It is a still further object of the present invention to provide a photovoltaic detector having a reduced junction capacitance.

It is a still further object of the present invention to provide a photovoltaic detector having an increased detectivity.

It is yet another object of the present invention to provide a photovoltaic detector easily susceptible to installation in a coaxial mounting.

It is still yet a further object of the present invention to provide a photovoltaic cell suitable for directional detection.

It is still yet another object of the present invention to provide a single layer, thin-film photovoltaic detector.

It is also an object of the present invention to provide a simplified method of fabricating photovoltaic detectors.

BRIEF DESCRIPTION OF THE DRAWINGS

Other objects and many of the attendant advantages of the present invention will be readily appreciated as the same becomes better understood by reference to the following detailed description when considered in connection with the accompanying drawings wherein primed numerals refer to the same or similar features as do equal, but unprimed numerals.

DETAILED DESCRIPTION OF THE EMBODIMENTS

Figure 1:
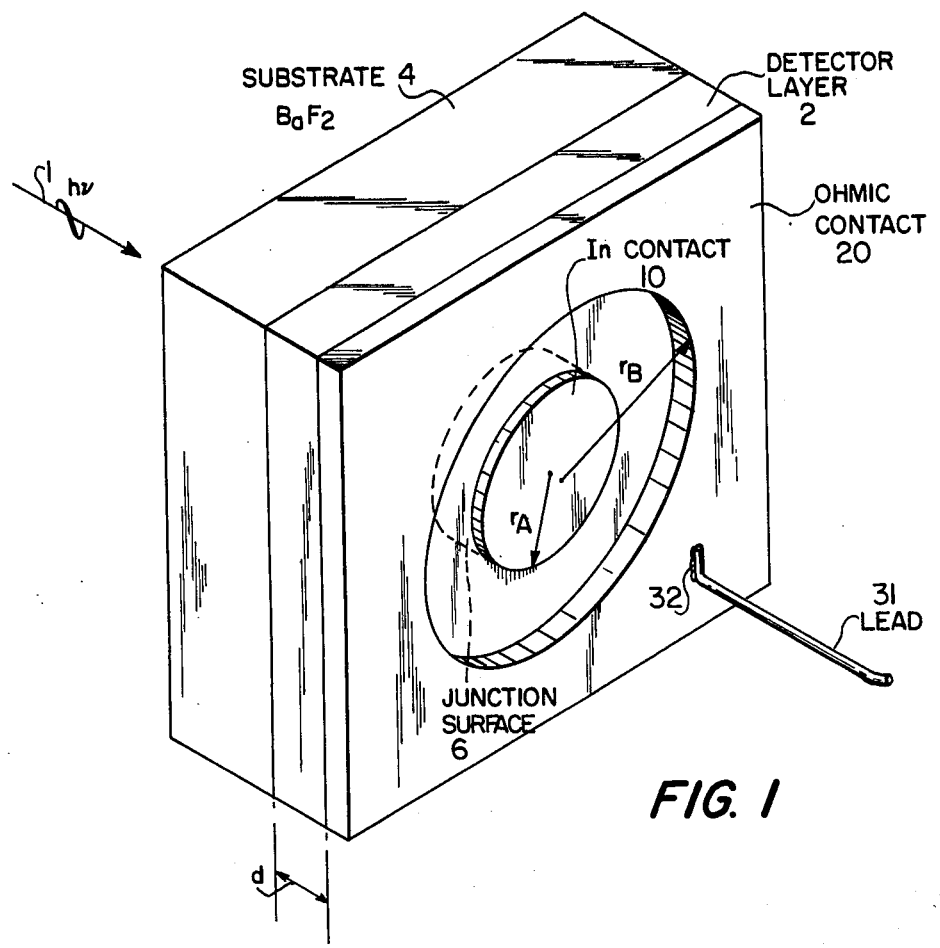
FIG. 1 is an isometric projection of a semiconductor of exaggerated dimensions constructed according to the teachings of the present invention.

Referring now to the drawings, and in particular to FIG. 1, a cabinet projection of a thin-film semiconductor photovoltaic detector is set forth. A thin, epitaxial layer 2 of a semiconductor material such as lead salt having a P-type conductivity, is grown by vacuum deposition upon one of a number of preferred planes of an optically transparent substrate 4. By epitaxial layer I mean a smooth, continuous single-crystal film grown on a substrate, such that the film crystal structure corresponds to and is determined by that of the single-crystal substrate. The lattice constants of the epitaxial layer and substrate materials are preferably the same, and both should have the same lattice structures. Application of a metal material having an excess of donor impurities to form an electrode 10 at a point on the exposed surface of P-type layer 2 allows the donor atoms to diffuse into layer 2. Electrode 10 may be applied to semiconductor 2 through a mask by vacuum deposition or by plating. The material of electrode 10 may be indium, bismuth, lead, or any of the known N-type conductivity dopants. Although the substrate 4 and epitaxial layer 2 are typically at room temperature when the material of electrode 10 is applied, raising the ambient temperature in the vacuum to the 150° to 300° Celius or higher range will hasten the diffusion of the donor impurities into the semiconductor layer 2, although diffusion of the impurities through detector layer 2 is not needed if the thickness of the layer 2 is 500 angstrom units or less as the region 7 beneath electrode 10 will be N-type due to the induced field of the non-ohmic contact.

Figure 2:
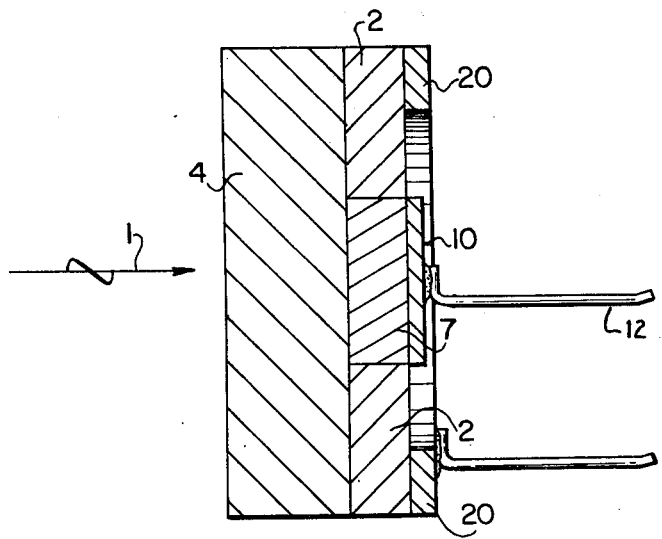
FIG. 2 is a cross-sectional view showing the semiconductor presented by FIG. 1.

Referring now to FIG. 2, it may be seen that the diffusion of donor impurity atoms into layer 2 creates beneath electrode 10 a N-type conductivity region 7 extending completely through P-type conductivity layer 2 to substrate 4. Consequently, a closed transverse junction 6 that may be approximately described geometrically as a right cylinder, extends between the perimeter of metal electrode 10 and the perimeter of a corresponding area on the adjacent surface of substrate 4. This geometry reduces the area of the junction to:

$$A_j = 2\pi r_A d \qquad (1)$$

where: $r_A$ is the radius of electrode 10; and, $d$ is the thickness of layer 2.

The effective optical area, $A_o$, depends upon two properties of the semiconductor material: the minority carrier diffusion lengths in the P-type conductivity region 2 and in the N-type conductivity region 6, $L_p$ and $L_n$, respectively.

$$A_o \simeq (L_p+L_n)^2, \text{ if } r_A = L_n. \tag{2}$$

A thin metallic layer (e.g., gold or platinum) is deposited on the exposed surface of semiconductor layer 2 to form an ohmic electrode 20. With respect to a P-type conductivity epitaxial layer 2, an ohmic contact is one that supplied a reservoir of charge carriers that are freely available to enter the epitaxial layer 2 as needed that is, a contact having a "work function" greater in value than the "work function" of epitaxial layer 2. The inner perimeter of ohmic contact 20 has a radius $r_B$, where $r_B - r_A$ is the distance between the outer perimeter of center electrode 10 and the inner perimeter of the outer contact 20. Quantum efficiency, $\eta$, in a photovoltaic detector is defined as the number of charge carriers crossing the junction per photon incident into the device. To assure the greatest efficiency obtainable (i.e., positioning the contacts 10, 20 so that there is a greater likelihood that photo-excited minority charge carriers will reach them before recombing), the radius $r_A$ of center electrode 10 is choosen to equal the diffusion length $L_n$ of the minority charge carrier in the underlying N-type conductivity region 7. For the same reason, the radius $r_B$ is choosen to equal the sum of the diffusion length $L_p$ of the minority charge carriers in the adjoining P-type conductivity region of semiconductor layer 2 and $L_n$:

$$r_A \simeq L_n, \text{ and} \tag{3a}$$

$$r_B \simeq L_p + L_n. \tag{3a}$$

Impingent electromagnetic radiation 1 passes through substrate 4 (which has been selected to be transparent to the wavelengths of anticipated radiation), enters the thin semiconductor layer 2, and generates an electron-hole pair. Radiation entering semiconductor layer 2 within the area defined by equation (2) generates minority charge carriers that are within one diffusion length of the junction area. Consequently, a potential difference is created across junction 6, and across the outer electrode terminal 31 and the inner electrode terminal 12. Electrode terminals 12, 31 may be attached to the surfaces of their respective electrodes 10, 20 either be thermal compression bonding, or with a bismuth, lead or tin alloy solder or conducting epoxy 13, 32. The material for semiconductor layer 2 may be lead telluride, lead selenide, lead sulfide, lead tin telluride ($Pb_xSn_{1-x}Te$, $0 \leq x \leq$ ), lead tin selenide ($Pb_ySn_{1-y}Se$, $0.4 \leq y \leq 1$), lead tin sulfide ($Pb_zSn_{1-z}S$, $0.8 \leq z \leq 1$), or alloys thereof. In addition to pellucid, mono-crystalline barium fluoride, the substrate material may be single crystals of lithium fluoride, sodium chloride, potassium chloride, cesium fluoride, cesium chloride, cesium bromide, calcium bromide, or strontium fluoride, although it is presently not known whether devices fabricated in commercial quantities on the latter substrate materials will exhibit increased values of detectivity.

Figure 3:
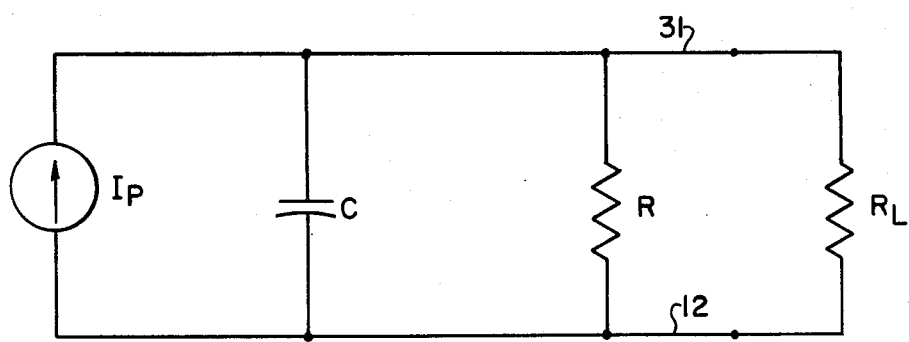
FIG. 3 is an electrical schematic diagram empirically representing a photovoltaic detector circuit.

Referring now to FIG. 3, a simple equivalent circuit of a photovoltaic detector sets forth the photocurrent source $I_p$, the junction capacitance D, the shunt resistance R, and the load resistance $R_L$ of an external circuit stage coupled across electrode terminals, 12, 31. The time constant $\tau_c$ of the detector, upon which the response speed depends, is simply:

$$\tau_c = R_T C, \tag{4}$$

where:
$R_T$ is the parallel equivalent resistance of R and $R_L$. For high frequency applications $R_L$ is taken as 50Ω, therefore $R_T \simeq R_L = 50\Omega$. The junction capacitance of an abrupt junction is:

$$C = \frac{(q\epsilon\epsilon_o)^{\frac{1}{2}} A_j (N_n P_p)^{\frac{1}{2}}}{(2V)^{\frac{1}{2}} (N_n + P_p)^{\frac{1}{2}}} \tag{5}$$

where:
$\epsilon$ is the static dielectric constant;
$\epsilon_o$ is the permitivity of free space;
q is the electron charge;
V is the potential barrier voltage;
$N_n$ is the majority electron concentration on the N-type conductivity side of the junction; and,
$P_p$ is the majority hole concentration on the P-type conductivity side of the junction. Although the present invention is applicable to graded junction as well as to abrupt junction devices, equation (5), descriptive of an abrupt junction device, is presented to illustrate the dependence of the junction capacitance upon the junction area. Therefore:

$$C \propto \frac{\epsilon\epsilon_o A_j}{W} = \frac{\epsilon\epsilon_o A_o}{WG} \tag{6}$$

where:
W is the width of the space charge region of the junction;
and,
G, the geometric gain, is the ratio between the effective optical area and the junction area.

A high geometric gain means a reduction in the junction surface 6 with a proportional decrease in the junction capacitance in accordance with equation (5) and a concomitant decrease in the time constant $\tau_c$. The net result is a quicker response speed.

The minimum detectable power, $P_{N,\lambda}$, frequently referred to as the noise equivalent power, may vary with the energy distribution of the source; it will aslo depend upon the amount of extraneous background radiation which reaches the detector from the thermal background. The reciprocal of $P_{N,\lambda}$, normalized to a detector area of one square centimeter with a one Hertz bandwidth, is the detectivity, $D_\lambda^*$. The usefulness of a photovoltaic detector depends mainly upon its detectivity, a value representing its ability to produce an electrical signal observable above the noise level. Detectivity of a thermal or Johnson noise limited detector can be expressed as:

$$D_\lambda^* = \frac{\eta q [A_o Z]^{\frac{1}{2}}}{2E_\lambda [kT]^{\frac{1}{2}}} \tag{7}$$

where: $\eta$ is the total quantum efficiency of the device;
q is the electron charge;
$A_o$ is the effective optical area;
Z is the impedance of the device;
E is the energy per photon at wavelength;
k is Boltzman's constant; and,
T is operating temperature.

EXAMPLE 1

A lead sulfide (i.e., PbS) photovoltaic detector may be prepared for operation at 77° K. in conformity with the structure of the device shown in FIGS. 1 and 2 of the drawings. Representative values may be:

$r_A = 1.2 \times 10^{-3}$ cm.;
$r_B = 2.3 \times 10^{-3}$ cm.;
$d = 1.2 \times 10^{-5}$ cm.;
$N_n = P_p = 10^{17}$ cm$^{-3}$;
$\mu_n = \mu_n$ (Hall mobility) = 20,000 cm$^2$/V-sec.;
$Y_n = Y_p$ (minority carrier lifetime) = $4 \times 10 - 8$ sec.;
$\epsilon = 175$;
$E_g$ (energy gap) = 0.31 eV;
$\lambda_c$ (cut-off wavelength) = 4.0 m;
N (refractive index) = 4.2; and,
$\alpha$ (absorption coefficient) = $10^4$ cm$^{-1}$ for E > Eg.

For the values of $r_A$ and d chosen, the junction area $A_j$ is $9.4 \times 10^{-8}$ square centimeters.

The effective optical area, $A_o$, given by Equation (2), equals $1.7 \times 10^{-5}$ square centimeters. Since:

$$L_n = L_p = \left[\frac{\mu \gamma kT}{q}\right]^{\frac{1}{2}} = 1.2 \times 10^{-3} \text{ cm}, \quad (8)$$

there is a geometric gain, G, of 184. From equation (6) it follows that the junction capacitance of the device is $7.8 \times 10^{-14}$ farads. With $R_L$ equal to 50Ω, the RC time constant of a detector preamplifier circuit would be only four picoseconds. The response time of this detector would be five nanoseconds, a value limited by the now dominant minority carrier lifetime of the semiconductor. In particular applications, this response time may be further shortened by reducing the minority carrier lifetime by varying either the operating temperature or the carrier density of the semiconductor material. A large area, highspeed detector may be fabricated from an array of these detectors coupled in parallel. For example, a one thousand element array would have a capacitance of $7.8 \times 10^{-11}$ farads, and an RC time constant of four nanoseconds. The capacitance and RC time constant of a conventional planar junction detector of equal area however, would be 184 times larger.

Quantum efficiency of the exemplary detector is the ratio of quanta absorbed in its effective optical area $A_o$ and thickness d to incident quanta. As a first order equation, the quantum efficiency is:

$$\eta = \frac{(1 - R)(1 - e^{-\alpha d})}{(1 - Re^{-2\alpha d})} \quad (9)$$

The reflection coefficient, R, is given by:

$$R = \left(\frac{N-1}{N+1}\right)^2 = 0.38. \quad (10)$$

From equation (9), the quantum efficiency, $\eta$, for the exemplary detector over its effective optical area $A_o$ is 14%.

The thin-film detector also has a higher theoretical detectivity than a conventional planar diode when used with a voltage mode (i.e., high impedance) preamplifier. It is well known that for a Johnson noise limited diode, the detectivity, $D_\lambda^*$, is given by Equation (7).

But, the impedance is:

$$Z = \frac{R \cdot \frac{1}{\omega C}}{R + \frac{1}{\omega C}} \quad (11)$$

where:
R is the d.c. resistance of the junction;
$\omega$ is the angular frequency, $2\pi f$; and,
C is the junction capacitance.

In PbS diodes, $R >> 1/\omega C$ at frequencies greater than one hundred Hertz. Then, $$Z \simeq \frac{1}{\omega C} = \frac{W}{\omega \epsilon \epsilon_o A_j} = \frac{WG}{\omega \epsilon \epsilon_o A_o} \quad (12)$$

Therefore, $$d_\lambda^*, \text{ (thin-film device)} = G \frac{\eta_{TF}}{\eta_D} \cdot D_\lambda^* \text{ (diode)}. \quad (13)$$

The quantum efficiency, $\eta_D$, of a reflection loss limited conventional diode is approximately equal to sixty hundredths, while for the thin-film device, quantum efficiency, $\eta_{th}$, is approximately fourteen hundredths. For this example, the geometric gain, G, is calculated as 184. Thus, the detectivity of the thin-film device is estimated to be $1.99 \times 10^{12}$ centimeters Hertz$^{\frac{1}{2}}$ Watt$^{-1}$, more than three times the detectivity of a conventional planar junction device.

In a photovoltaic detector electrically representable by the parallel equivalent circuit shown in FIG. 3 (i.e., in a parallel RC semiconductor device driven by a high frequency current source $I_p$), the value of the capacitance C dominates in an inverse proportion the magnitude of the impedance, Z, at high frequencies. Accordingly, a reduction in the value of junction capacitance means an increase in the magnitude of the impedance function, and, by equation (7), an enhancement in the detectivity.

EXAMPLE II

Figure 4:
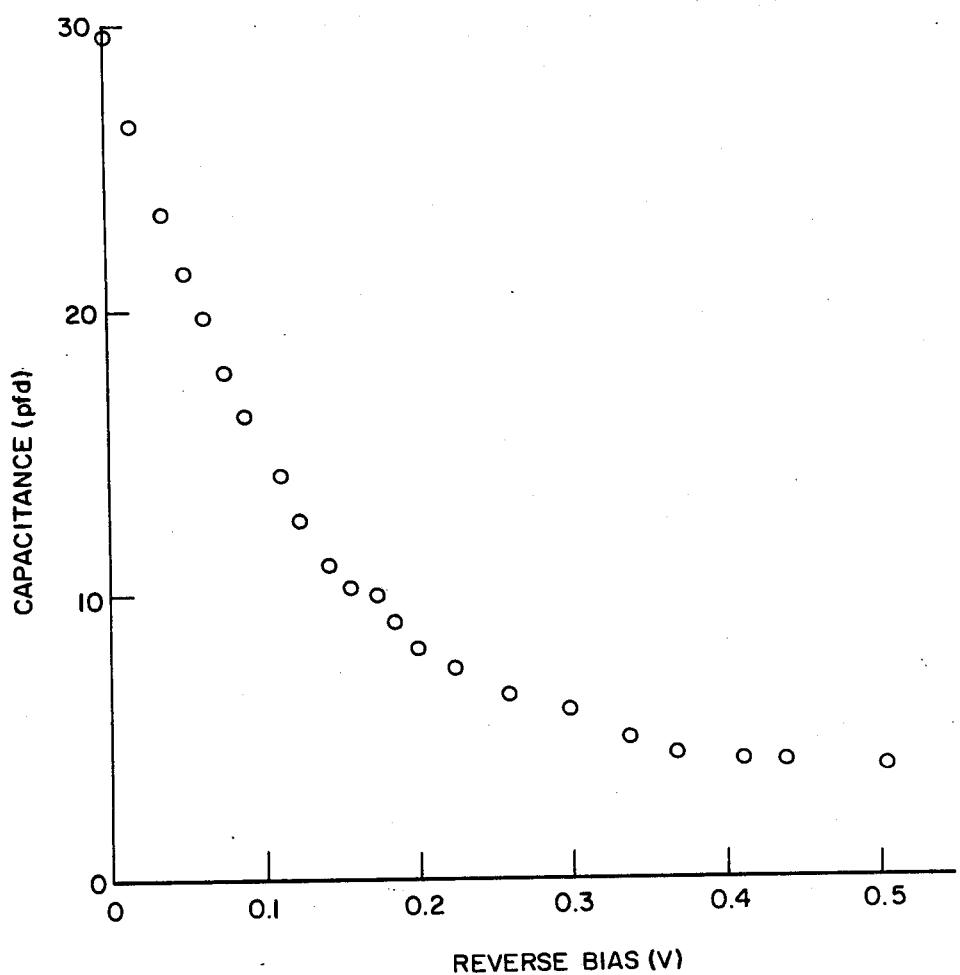
FIG. 4 is a graph showing the variation of junction capacitance with the reverse bias voltage. The abscissa and ordinate are one-tenth of a volt per division and ten picofarads per division, respectively.

Referring now to FIG. 4 where a graph plotting measured values of voltage and capacitance along its abscissa and ordinate coordinates respectively, sets forth the inverse dependence of junction capacitance upon an applied reverse bias. The embodiment from which these values were measured was fabricated by applying a donor rich Indium strip to the semiconductor detector layer surface and forming the transverse junction by allowing the donor atoms to diffuse through the detector layer. The area of the indium contact was $1 \times 10^{-4}$ square centimeters. The capacitance varied between approximately 29 picofarads with zero applied bias and 3 picofarads with 0.52 volts reverse bias. These values of capacitance would have been at least one order of magnitude lower (i.e., two orders of magnitude lower than the junction capacitance of a conventional planar junction device or equal area) except for an imperfect structure caused by the location of the junction abutting an edge of the detector layer.

Figure 5:
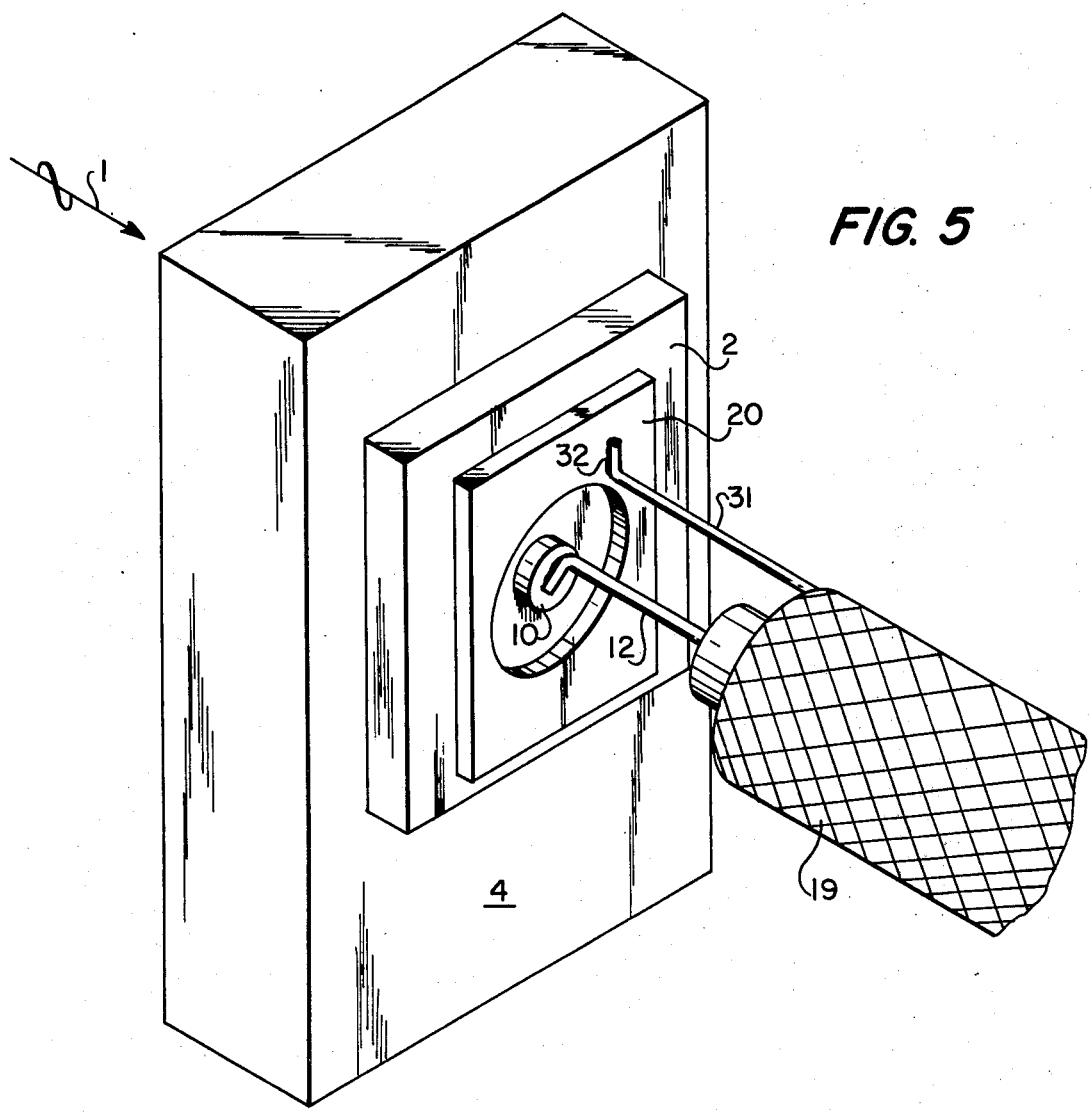
FIG. 5 is an exploded isometric view of a photovoltaic detector constructed according to the teachings of the present invention electrically coupled to one end of a coaxial cable.

Referring now to FIG. 5, it may be appreciated that the present invention provides a photovoltaic detector on which the electrodes 10, 20 are available for direct and immediate coupling via leads 12, 31 respectively, to coaxial cable 19 and an external circuit. This coupling feature minimizes stray capacitance while erecting no obstruction to impingent electromagnetic radiation seeking to pass through transparent substrate 4.

Figure 6:
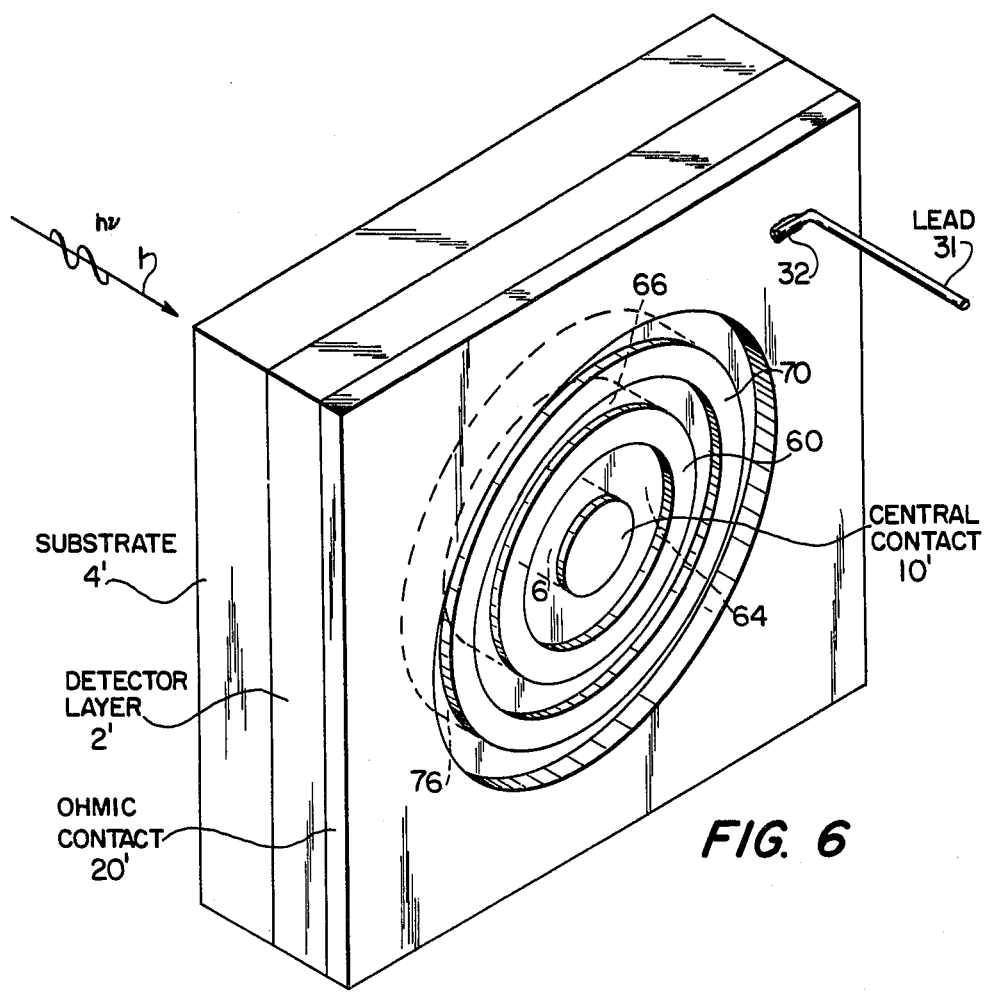
FIG. 6 is a isometric projection of multi-junction photovoltaic detector, an alternative form of a semiconductor constructed according to the teachings of the present invention.
Figure 7:
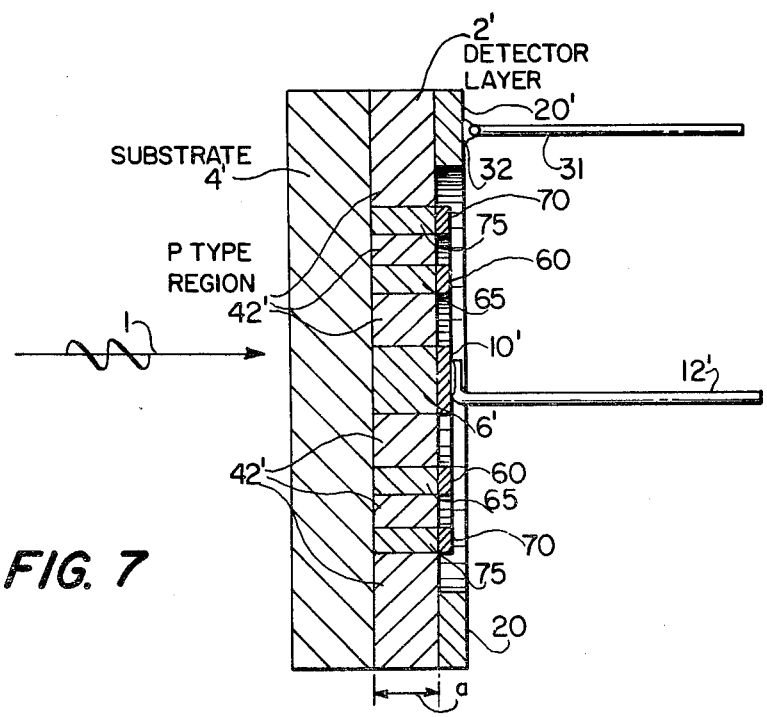
FIG. 7 is a cross-sectional view showing the semiconductor presented by FIG. 6.

From the foregoing discussion, it will be apparent that this invention has broad application in photovoltaic fabrication and detection. Although the embodiments of this invention discussed in the foregoing paragraphs all included a semiconductor layer of one type conductivity into which a region of a second and opposite type conductivity was created in a regular geometric shape (e.g., a cylinder) by vacuum diffusion of an impurity bearing electrode material, it is not necessary that the opposite conductivity region approximate a regular geometric shape. Additionally, each of the foregoing embodiments contained but one region of opposite conductivity. Reference to FIG. 6, in conjunction with FIG. 7, shows the feasibility of a multi-junction semiconductor suitable for photovoltaic applications. A semiconductor layer $2'$ of a first-type conductivity is epitaxially grown on a substrate $4'$ that is transparent over the spectra of interest. A central region $6'$ of the opposite type conductivity and having a width, $2r_A$, equal to twice the diffusion length of its minority carriers, $L_2$, is formed by vacuum deposition of the material for electrode $10'$. A second toroidal region 65 with an inner radius, $r_B$, equal to the sum of $L_2$ and the diffusion length, $L_1$, of the minority carriers of the adjacent region $2'$ is similarly formed. The outer perimeter of region 65 is less than or equal to the diffusion length, $L_2$, of its minority charge carriers and has an inner radius $r_c$ equal to the sum of $L_1$ and twice $L_2$. Region 65 forms two back-to-back junction surfaces 64, 66 with the abutting regions 42 of detector layer $2'$. A third region 75 or opposite conductivity and a cross-sectional width less than or equal to its minority charge carrier length $L_2$, is similarly formed with an inner radius $r_D$ equal to the sum of two diffusion lengths $L_1$ and two diffusion lengths $L_1$ and three diffusion lengths $L_2$. Region 75 forms two back-to-back junctions surfaces 74, 76 with the abutting first conductivity regions 42 of detector layer $2'$. An outer ohmic contact $20'$ is formed on the surface semiconductor layer $2'$ at a distance one diffusion length, $L_1$, from the outer radius of region 76. In operation, a bias is applied across terminals $12'$, $31'$ coupled to electrode $10'$ and outer electrode $20'$, respectively. This bias is distributed asymmetrically across the back-to-back junction rings. The reverse biased junctions will produce photovoltages which will sum up and appear across electrodes $12'$ and $31'$.

Figure 8:
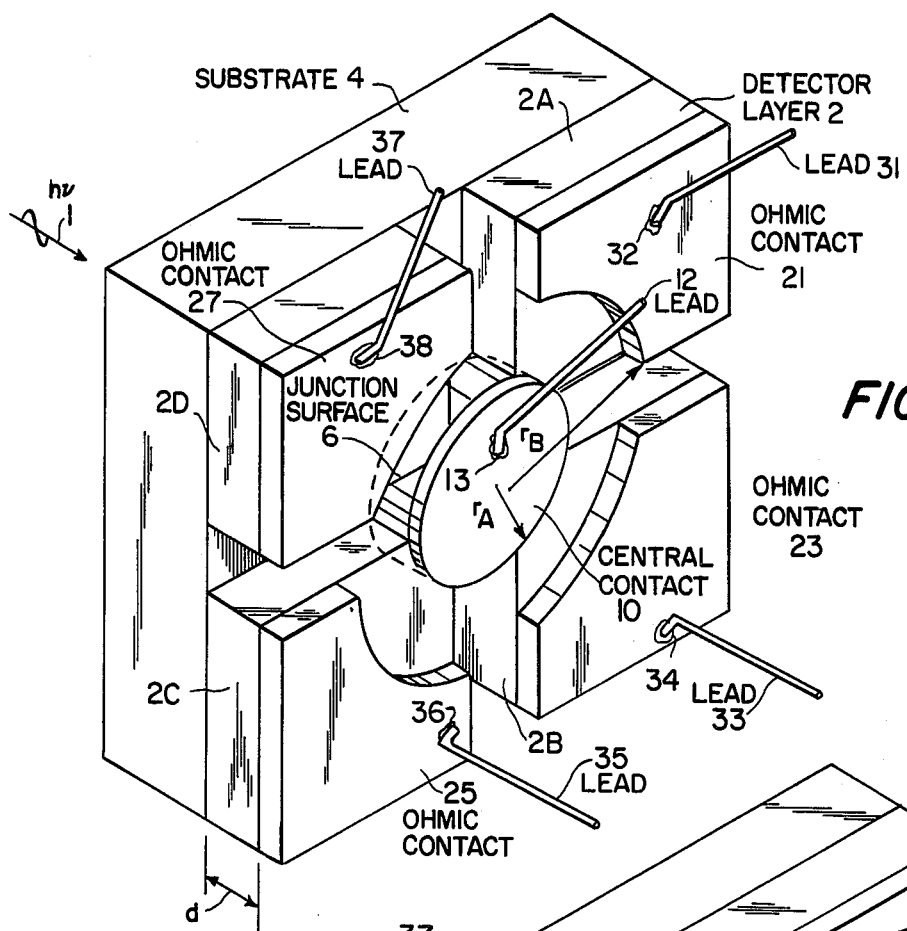
FIG. 8 is an isometric projection of a quadrature photovoltaic detector, another form of a semiconductor constructed according to the teachings of the present invention.

Referring now to FIG. 8, where an alternative embodiment of the photovoltaic cell presented by FIGS. 1 and 2 is set forth, detector layer 2 is segmented by quadrature, radial grooves that extend down to the insulating substrate 4, and from the outer perimeter of the layer to the cylindrical junction surface 6 of the central N-type conductivity region 7 beneath central electrode 10. Detector layer 2 resembles four petals attached to the circumference of a central stem 7. Ohmic contact 20 is segmented into four contacts 21, 23, 25, 27. Each segment is separated form central electrode 10 by one diffusion length of less, and from each other by the width of the intervening eletrical insulator (e.g., a groove filled with air). Each petal 2A, 2B, 2C, 2D of the P-type conductivity materials of detector layer 2 (i.e., that material of detector layer 2 surrounding the region of N-type conductivity 6) is separated from adjacent petals by the width of the intervening electric insulator (e.g., a groove filled with a material considered to be a "good" electric insulator, such as air or silicon dioxide).

As the insulators merely serve to electrically isolate adjacent petals, their dimensions need only be sufficient to prevent arcing between adjacent electrical contacts 21, 23, 25, 27. Electromagnetic radiation within the response spectrum of the cell and impingent upon the area defined by equation (2), generates charge carrier pairs, thus causing a potential difference between central electrode 10 and that ohmic contract 21, 23, 25, or 27 nearest the point of generation. The segmented ohmic contact used the tendency of charge carriers to recombine within an average of one diffusion length from the point of generation, to provide a potential indicative of the quadrant of origin of impingent radiation.

Figure 9:
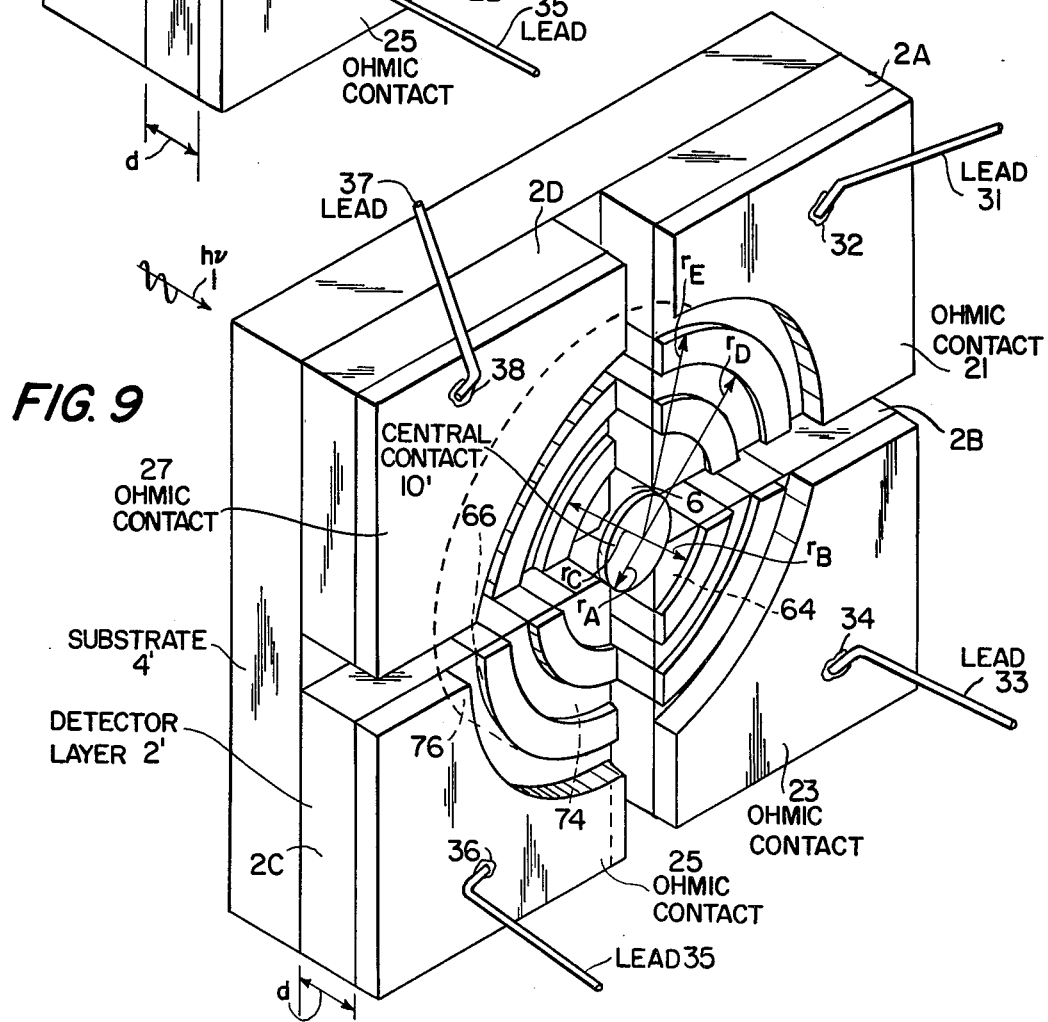
FIG. 9 is an isometric projection of a multi-junction quadrature photovoltaic detector.

FIG. 9 sets forth an alternative embodiment of the multi-ring cell presented by FIGS. 6 and 7. The cell shown in the latter, is segmented in the manner discussed in reference to the embodiment shown in FIG. 8 to provide four outer contacts, 21, 23, 25, 27, and concentric sets of intermediate contacts 60A, 60B, 60C, 60D, 70A, 70B, 70C, 70D. Although this embodiment functions similarly to that shown in FIG. 8, the presence of back-to-back junctions 64, 66 and 74, 76, necessitates the application of a bias voltage between the lead (not shown) to central electrode $10'$ and each of the leads, 31, 33, 35, 37 to the ohmic contacts 21, 23, 25, 27 respectively.

In the teachings of the foregoing paragraphs, a photovoltaic cell displaying a closed transverse P-N junction is disclosed. Differentation between and transverse location of the junction and effective optical surfaces allows an increased effective optical area, and thus a two orders of magnitude decrease in junction capacitance to provide a quicker electrical response, while closure of the junction surface forestalls a concomitant decrease in quantum efficiency and detectivity. Coextension of a central electrode and one surface of the corresponding conductivity region provides an enhancement of the quantum efficiency, and therefore, the detectivity of the cell. Segmentation of the detector layer and the outer ohmic contact furnishes a directional potential indicative of the origin of impingent electromagnetic radiation.

It will be considered therefore, that all of those changes and modifications which fall fairly within the scope of the invention shall be a part thereof. For example, a multitude of simple photovoltaic devices may be fabricated in a single epitaxial layer grown on an insulating crystalline substrate by diffusing a plurality of spaced, central electrodes of a material having an excess of donor impurities into the epilayer 2. To minimize crosstalk, the central electrodes should be spaced at least two diffusion lengths apart. In addition, the directional detection devices set forth in FIGS. 8 and 9 may be fabricated with a central ohmic contact 10, $10'$, surrounded by a plurality of (non-ohmic) diffused electrode contacts 21, 23, 25, 27 and $21'$, $23'$, $25'$, $27'$, respectively. Also, an operable directional detector may be fabricated with a single, non-segmented detector layer 2 merely by segmenting the ohmic contact with an array of electrical insulators (e.g., radial grooves extending through the ohmic contact to the detector layer) perhaps one diffusion length wide. Finally, the detector layer may be of a N-type conductivity material while the material of the central electrode is a dopant rich in acceptor impurities.

What is claimed as new and desired to be secured by Letters Patent of the United States is:

1. A method of making a photovoltaic detector, comprising the steps of:
  depositing in a vacuum chamber at an elevated temperature an epitaxial layer of semiconductor material having a first type conductivity upon an electrically insulating crystalline substrate, whereby the epitaxial layer has two major opposed surfaces being respectively, the top and the substrate-mating surfaces;
  the material being selected from the Group consisting of:
   lead salts,
   lead tin salts,
   lead cadmium salts,
   cadmium salts,
   or alloys thereof;
  cooling the crystalline substrate and epitaxial layer;
  depositing upon an undefined portion of the top surface a non-ohmic electrical contact of a metal rich in a second and opposite type conductivity impurity; and,
  thermally treating the resulting product to bring about diffusion of said second and opposite type conductivity impurities through to the substrate-mating surface of said epitaxial layer.

2. The method set forth in claim 1 wherein the semiconductor material is selected from the group consisting of:
  lead telluride (PbTe),
  lead selenide (PbSe),
  lead sulfide (PbS),
  cadmium sulfide (CdS),
  cadmium selenide (CdSe),
  lead cadmium sulfide (PbCdS),
  lead tin telluride ($Pb_xSn_{1-x}Te$),
  lead tin selenide ($Pb_ySn_{1-y}Se$),
  lead tin sulfide ($Pb_zSn_{1-z}S$),
  or alloys thereof,
  where:
   $0 \leq x \leq 1$, $0.4 \leq y \leq 1$, and $0.8 \leq z \leq 1$.

3. The method set forth in claim 1, further comprising:
  ceasing deposition of the semiconductor material before the epitaxial layer attains a thickness greater than twelve hundred angstrom units.

4. The method set forth in claim 1 further comprising:
  depositing the electrical contact when the epitaxial layer is at room temperature.

5. The method set forth in claim 1, further comprising:
  ceasing deposition of the semiconductor material before the epitaxial layer attains a thickness greater than five hundred angstrom units.

6. The method set forth in claim 5, further comprising:
  depositing the electrical contact when the epitaxial layer is at room temperature.

* * * * *